(12) United States Patent
Chan et al.

(10) Patent No.: US 7,955,928 B2
(45) Date of Patent: Jun. 7, 2011

(54) STRUCTURE AND METHOD OF FABRICATING FINFET

(75) Inventors: Kevin K. Chan, Staten Island, NY (US); Zhibin Ren, Hopewell Junction, NY (US); Xinhui Wang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 12/413,836

(22) Filed: Mar. 30, 2009

(65) Prior Publication Data

US 2010/0244103 A1    Sep. 30, 2010

(51) Int. Cl.
*H01L 21/8242* (2006.01)
(52) U.S. Cl. .................. 438/249; 257/E21.468
(58) Field of Classification Search ............ 438/248; 257/E21.468
See application file for complete search history.

(56) References Cited

U.S. PATENT DOCUMENTS

| 6,770,516 | B2 * | 8/2004 | Wu et al. ................ 438/154 |
| 2007/0257315 | A1 | 11/2007 | Bedell et al. |
| 2008/0224256 | A1 | 9/2008 | Chou et al. |
| 2008/0258220 | A1 | 10/2008 | Bedell et al. |

\* cited by examiner

*Primary Examiner* — W. David Coleman
(74) *Attorney, Agent, or Firm* — Joseph P. Abate; Roberts Mlotkowski Safran & Cole, P.C.

(57) ABSTRACT

A CMOS FinFET device and a method of manufacturing the same using a three dimensional doping process is provided. The method of forming the CMOS FinFET includes forming fins on a first side and a second side of a structure and forming spacers of a dopant material having a first dopant type on the fins on the first side of the structure. The method further includes annealing the dopant material such that the first dopant type diffuses into the fins on the first side of the structure. The method further includes protecting the first dopant type from diffusing into the fins on the second side of the structure during the annealing.

29 Claims, 7 Drawing Sheets

STRUCTURE AND METHOD OF FABRICATING FINFET

FIELD OF THE INVENTION

The present invention relates generally to a semiconductor structure and method of manufacturing and, more particularly, to a CMOS FinFET device and a method of manufacturing the same using a three dimensional doping process.

BACKGROUND

Fin field-effect transistors (FinFETs) are double-gate transistors built on an SOI/bulk semiconductor substrate. In implementation, the gate is wrapped around the channel of the FET, forming a double gate structure. More particularly, in a conventional FinFET a portion of the silicon has been etched into a thin, "fin"-like shape. That is, a narrow body of silicon with channels on each side is formed on a wafer, such as a silicon oxide insulating (SOI) wafer. A gate electrode is applied to the "fin" such that it wraps around on two or more sides.

The FinFET device has significantly better control of short channel effect and higher or equivalent current density than conventional CMOS technologies, and may be used in almost all types of integrated circuit designs (i.e., microprocessors, memory, etc.). Specifically, the use of the double gate suppresses Short Channel Effects (SCE), provides for lower leakage, provides for more ideal switching behavior, and reduces power consumption. In addition, the use of the FinFET increases gate area, which allows the FinFET to have better current control, without increasing the gate length of the device. As such, the FinFET is able to have the current control of a larger transistor without requiring the device space of the larger transistor.

In fabrication processes, conventional ion extension implants and halo implants are used to implant dopants in the source/drain (S/D) region of the device. For example, a halo implant is a fabrication step which involves the doping of regions beneath the lightly-doped source/drain (S/D) extension regions of the transistor so as to form halo regions. For each of such halo regions, only the portion under the gate region (called undercutting portion) is useful, and therefore desirable, whereas the rest of the halo region has the effect of reducing the doping concentration of the respective S/D region (called the S/D doping reduction effect), which is undesirable.

The conventional extension and halo implantation process, though, may cause some undesirable effects on the FinFET. For example, the extension and halo implants may result in straggle. Straggle is the lateral diffusion under the gate which will degrade short channel effects, since the straggle effectively shortens the channel length. Also, the extension and halo implants may amorphize the material of the FinFET. That is, the high energy of the dopant used during the ion implantation process will cause displacement of the silicon atoms from the lattice structure thereby damaging the fin Si. Although amorphization reduces problems with metal diffusion that can occur during salicide formation anneal process, the amorphization-related defects are known to impede a subsequent epitaxial growth on the fin due to a decrease in the integrity of the material. For this reason, the external resistance of the FinFET can be impaired due to the difficulty in the epi growth merge process, which would otherwise increase the area of the FinFET and, in turn, reduce the external resistance of the FinFET.

Accordingly, there exists a need in the art to overcome the deficiencies and limitations described hereinabove.

SUMMARY

In a first aspect of the invention, a method of forming a structure comprises forming fins on a first side and a second side of a structure and forming spacers of a dopant material having a first dopant type on the fins on the first side of the structure. The method further comprises annealing the dopant material such that the first dopant type diffuses into the fins on the first side of the structure. The method further comprises protecting the first dopant type from diffusing into the fins on the second side of the structure during the annealing.

In another aspect of the invention, a method of forming FinFET structures is provided. The method comprises: etching fins on a first side of a structure and a second side of the structure; protecting the fins on the first side of the structure from a thermal diffusion process performed on the fins on the second side of the structure; forming spacers with a first dopant type on the fins on the second side of the structure; and performing the thermal diffusion process on the fins on the second side of the structure by annealing the spacers such that the first dopant type diffuses into the fins on the second side of the structure.

In yet a still further aspect of the invention, a method of forming a structure comprises thermally diffusing a first dopant type from a spacer material into fins on a first side of a structure while protecting fins on a second side of the structure from the first dopant type diffusing into the fins on the second side of the structure.

In yet a still further aspect of the invention, a structure comprises a first set of fins on an nFET side of the structure. The first set of fins have diffused dopant of a first dopant type which also extends laterally under respective gates to an extent of a thickness of a spacer material used for thermally diffusing the first dopant type into the first set of fins. The structure also comprises a second set of fins on a pFET side of the structure. The second set of fins have diffused dopant of a second dopant type which also extends laterally under respective gates to an extent of a thickness of a spacer material used for thermally diffusing the second dopant type into the second set of fins. The structure and method can be used in a design structure embodied in a machine-readable medium for designing, manufacturing, or testing an integrated circuit.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a semiconductor structure and method of manufacturing. More specifically, the present invention relates to a CMOS FinFET device and a method of manufacturing the same using a three dimensional doping process. Advantageously, the method of the present invention maintains the integrity of the FinFET during implantation processes by using a thermal diffusion process. More specifically, the method of the invention performs an annealing process on a deposited gate sidewall (spacer) material in order to perform an extension and/or halo implantation process. The resultant structure has decreased overall lateral diffusion under the gate thereby improving the overall integrity of the structure (FinFET). The improved structural integrity also results in an improved subsequent epitaxial merging process which increases the external resistivity of the FinFET.

First Aspect of the Invention

FIGS. 1-7 show fabrication processes and respective structures for manufacturing a structure in accordance with a first aspect of the invention. In particular, the exemplary starting structure shown in FIG. 1 includes a SOI layer 12 on a BOX 10. In embodiments, the BOX 10 can have a thickness of about 1400 Å; although, other dimensions are also contemplated by the invention. The SOI layer 12 can be about 30 nm, with other dimensions also contemplated by the invention. An oxide mask 14 is deposited on the SOI layer 12. The oxide mask 14 can be of different thicknesses depending on the particular application, e.g., the dimensions of the SOI layer 12 and BOX 10. In one embodiment, the oxide layer 14 can be about 30 nm in thickness.

Figure 1:
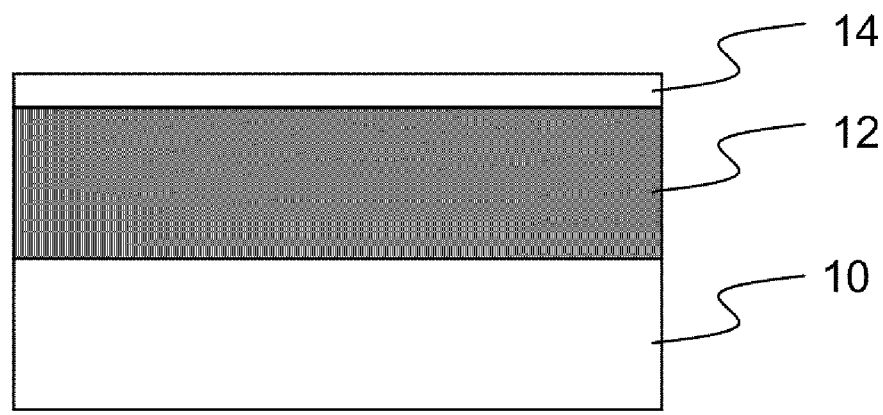
FIGS. 1-7 show fabrication processes and respective structures for manufacturing a structure in accordance with a first aspect of the invention.
Figure 2:
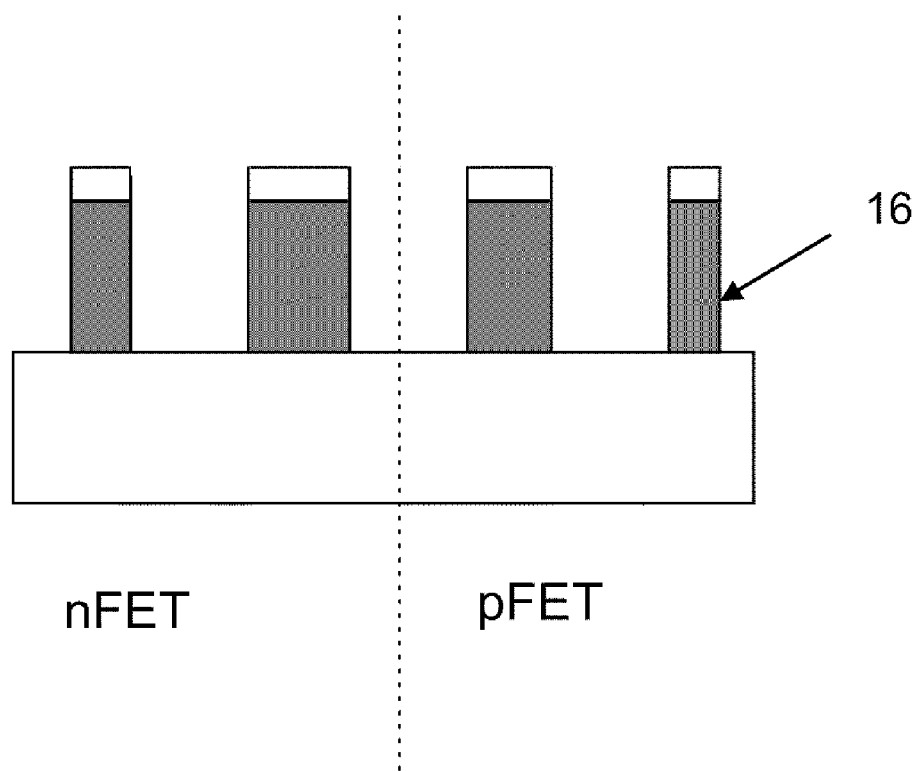

Referring now to FIG. 2, fins (mandrels) 16 are formed on the structure using conventional lithographic and etching process. For example, the mask 14 may be exposed to light to form openings. A reactive ion etching (RIE) is then be performed to form trenches, resulting in mandrels (e.g., Si fins) 16. In embodiments, the fins 16 can be approximately 10-20 nm in width (e.g., diameter); although, other dimensions are also contemplated by the present invention. The fins 16 are formed simultaneously on both an nFET and pFET side of the device.

Figure 3:
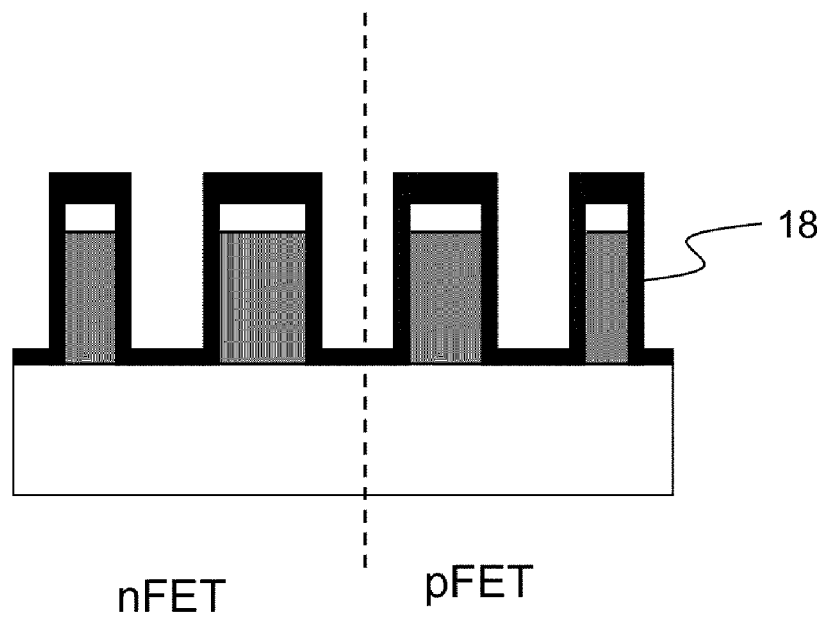

As shown in FIG. 3, a liner 18 is deposited on the structure of FIG. 2. More particularly, the liner 18 is deposited on the fins 16 and exposed BOX 10. In embodiments, the liner 18 is a nitride liner which is deposited on the fins 16 and exposed BOX 10 over the nFET and pFET, simultaneously. In embodiments, the liner 18 is deposited using a conventional LPCVD process. The liner 18 can have a thickness of about 20 nm to 30 nm; although, other dimensions are also contemplated by the present invention.

Figure 4:
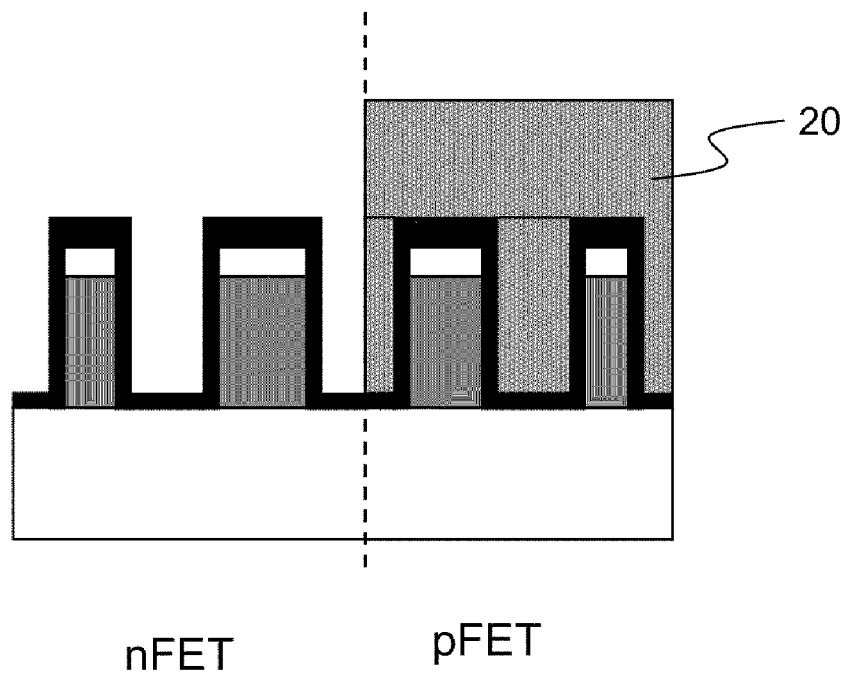

In FIG. 4, a photoresist 20 is deposited on the pFET side of the structure. This will allow further process steps to be conducted on the nFET side of the structure, as discussed in further detail with reference to FIGS. 5-7. As will be discussed in further detail below, the photoresist 20 can be deposited on the nFET side of the structure, which will allow further process steps to be conducted on the pFET side of the structure.

Figure 5:
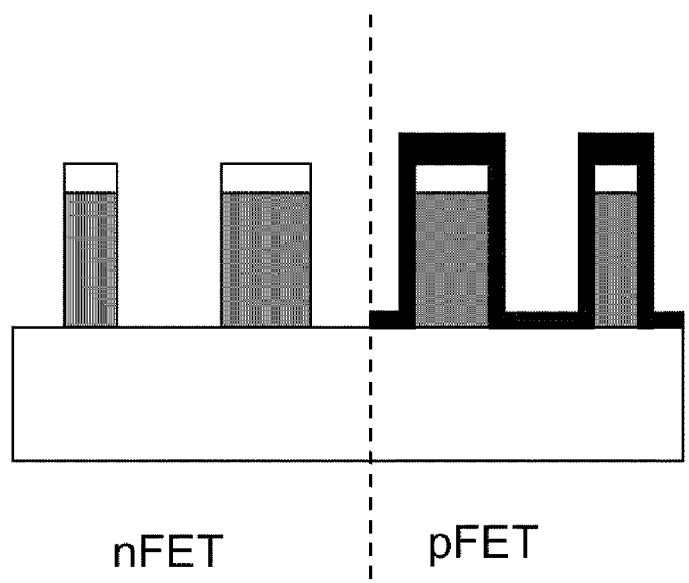

FIG. 5 shows the removal of the nitride liner on the nFET side of the structure and the stripping of the photoresist on the pFET side of the structure. More specifically, the nitride liner is removed from the nFET side of the structure using a conventional reactive ion etch (RIE). The photoresist is stripped from the pFET side of the structure using, for example, an oxygen plasma stripping process.

Figure 6:
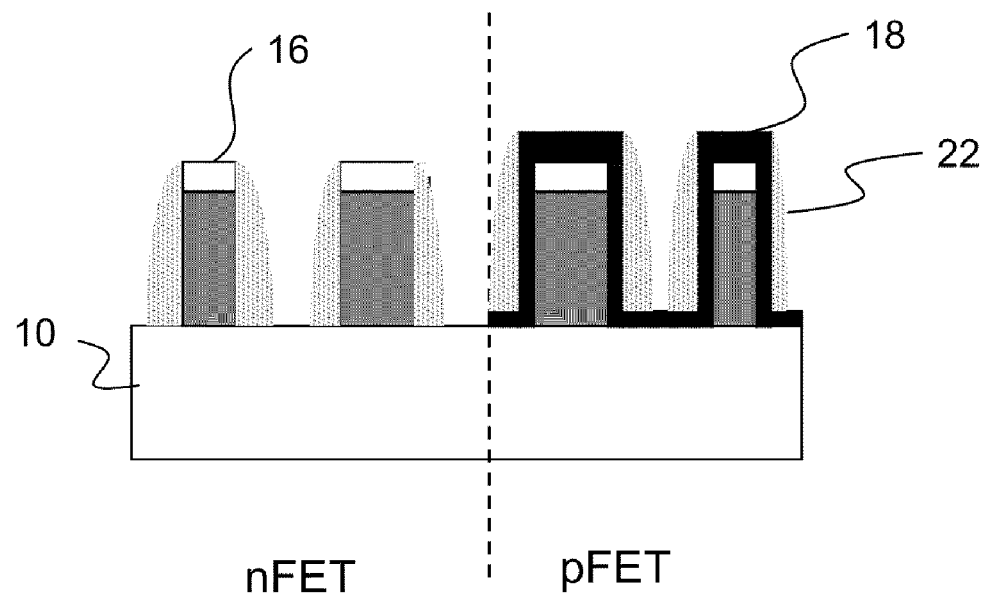

FIG. 6 shows a deposition and spacer RIE process in accordance with aspects of the invention. More specifically, a PSG (phosphosilicate glass) 22 is deposited on the entire structure of FIG. 5, i.e., over the nitride liner 20 on the pFET side of the structure and directly contacting the fins 16 and BOX 10 on the nFET side of the structure. In embodiments, the PSG (phosphosilicate glass) 22 is deposited to a thickness of about 10 to 20 nm; although, other dimensions are contemplated by the present invention. In a subsequent processing step, a spacer RIE is performed to open the PSG (phosphosilicate glass) 22 to the BOX 10. This process effectively forms spacers on the fins 16 on the nFET side of the structure. In this etching process, there is no need for a mask, since the spacer RIE is an anisotropic, directional etching process, i.e., vertical etching with minimal lateral etching. The resulting thickness of the PSG (phosphosilicate glass) 22 after the etching step can range from about 5-15 nm, with the expectation that other dimensions are also contemplated depending on the initial thickness of the fins 16.

Figure 7:
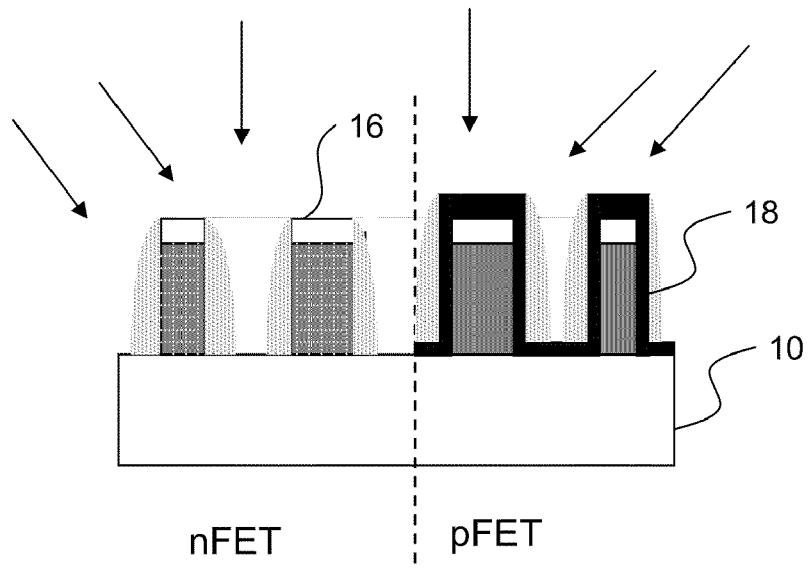

In the processing steps of FIG. 7, the remaining PSG (phosphosilicate glass) 22 is annealed at a temperature of about 450° C. to 800° C. for about 30 seconds to about 10 minutes. This annealing process is a thermal diffusion process which results in the diffusion of the phosphorous into the fins 16 on the nFET side of the device. Of course, by adjusting the annealing process, more or less phosphorous will diffuse into the fins 16 on the nFET side of the device. Also, during the annealing process, the fins 16 on the pFET side of the device are protected by the nitride liner 18.

Advantageously, the thermal diffusion of the phosphorous will not cause damage to the fins 16 and will minimize lateral diffusion under the gate structure. In fact, the lateral diffusion of the phosphorous is limited to the thickness of the spacer (PSG (phosphosilicate glass)) 22 at the interface of the BOX 10. The thermal diffusion process of the present invention improves the integrity of the fins 16 for subsequent epitaxial merging processes to reduce the external resistivity of the FinFET.

Figure 8:
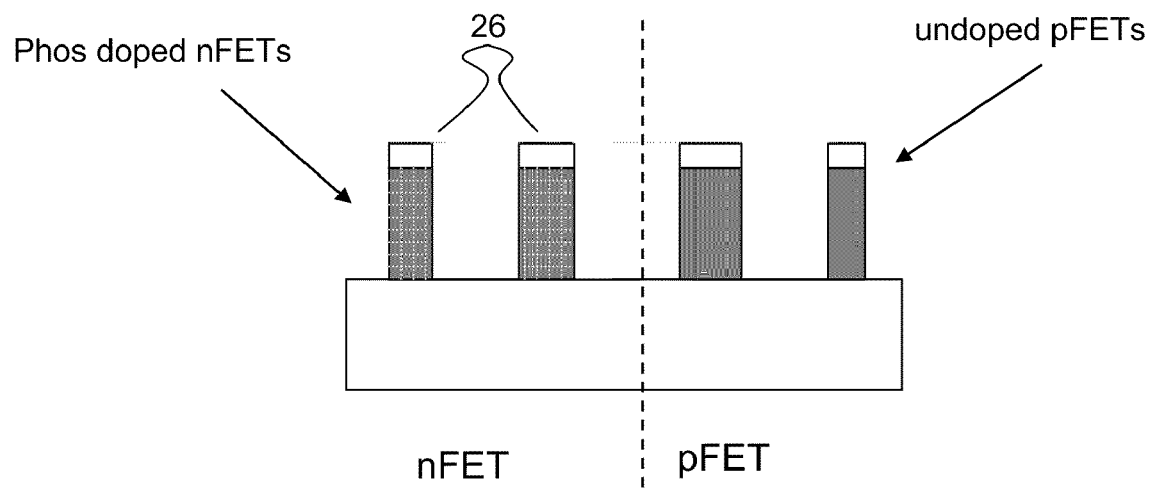
FIG. 8 shows a final structure and respective processing steps in accordance with the first aspect of the invention.

FIG. 8 shows a final structure used to build a device in accordance with aspects of the invention. In FIG. 8, the PSG (phosphosilicate glass) and nitride liner are stripped from the pFET side of the structure. More specifically, the PSG is stripped using a diluted or buffered HF solution. The nitride liner can be stripped using a phosphoric acid. The resultant structure is a device with dopant diffused in the fins 16 on the nFET side of the structure. The dopant type (phosphorous) diffuses into the underlying BOX 10 adjacent to the fins 16 only to an extent of a thickness of the spacers 22.

Second Aspect of the Invention

FIGS. 9-12 show fabrication processes and respective structures for manufacturing a device in accordance with a second aspect of the invention. FIGS. 9-12 show the processes for extension/halo implantation on the pFET side of the device, and can be performed before or after the diffusion process for the nFET device. In embodiments, both the nFET and pFET side of the device will undergo the novel diffusion processes of the present invention. The processing steps of FIGS. 9-12 are similar to that described with reference to FIGS. 1-8 and, as such, are shown in an abbreviated version for purposes of facilitating the understanding and discussion thereof.

Figure 9:
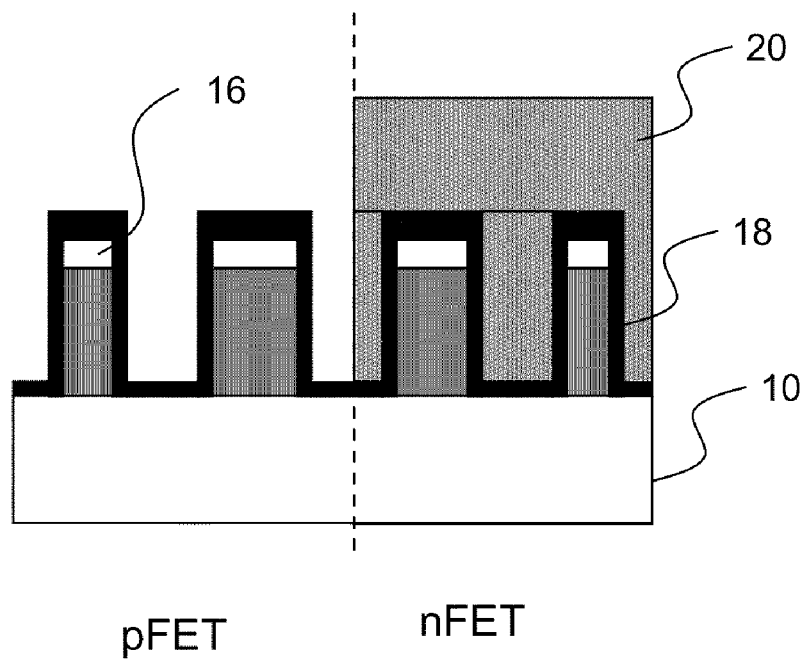
FIGS. 9-11 show fabrication processes and respective structures for manufacturing a structure in accordance with a second aspect of the invention.

More specifically, FIG. 9 shows an intermediate structure of the nitride liner 18 on the fins 16 and a photoresist 20 is deposited on the nFET side of the structure. This will allow further process steps to be conducted on the pFET side of the structure, as discussed in further detail with reference to FIGS. 10-12. Those of skill should understand that the fins 16, deposition of the nitride liner 18 and the deposition of the photoresist 20 are formed in a similar manner as described with reference to FIGS. 1-4. For example, in embodiments, the fins 16 can be approximately 10-20 nm in width (e.g., diameter). The fins 16 are also formed on both an nFET and pFET side of the device, simultaneously.

Figure 10:
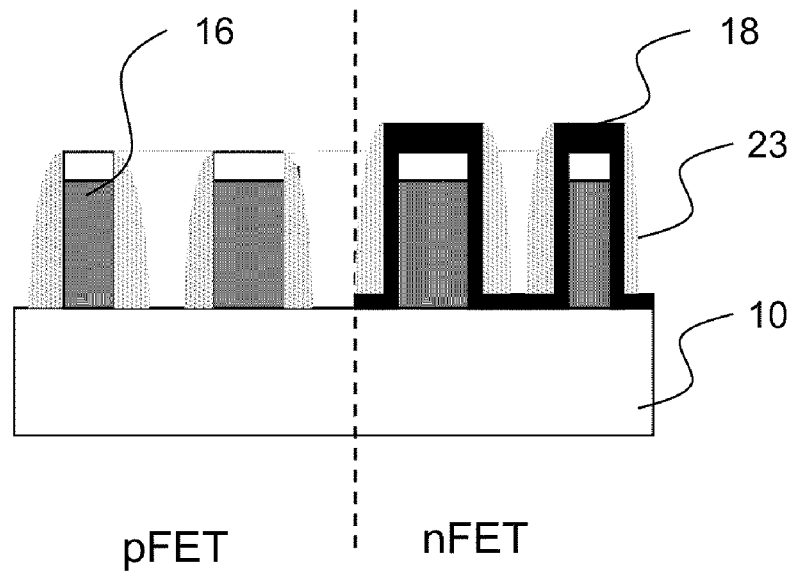

FIG. 10 shows the removal of the nitride liner on the pFET side of the structure and the stripping of the photoresist on the nFET side of the structure. More specifically, the nitride liner is removed from the pFET side of the structure using a conventional reactive ion etch (RIE). The photoresist is stripped from the nFET side of the structure using, for example, an oxygen plasma stripping process.

FIG. 10 further shows a deposition and spacer RIE process in accordance with aspects of the invention. More specifically, a BSG (boro-silicate-glass) 23 is deposited on the entire structure of FIG. 10, i.e., over the nitride liner 20 on the nFET side of the structure and directly contacting the fin 16 and BOX 10 on the pFET side of the structure. In embodiments, the BSG 23 is deposited to a thickness of about 10 to 20 nm; although, other dimensions are contemplated by the present invention.

In a subsequent processing step, a spacer RIE is performed to open the BSG 23 to the BOX 10. This process forms spacers on the fins 16 on the pFET side of the structure. In this etching process, there is no need for a mask, since the spacer RIE is an anisotropic, directional etching process, i.e., vertical etching with minimal lateral etching. The resulting thickness of the BSG 23 after the etching step can range from about 5-15 nm, with the expectation that other dimensions are also contemplated depending on the initial thickness of the fin 16.

Figure 11:
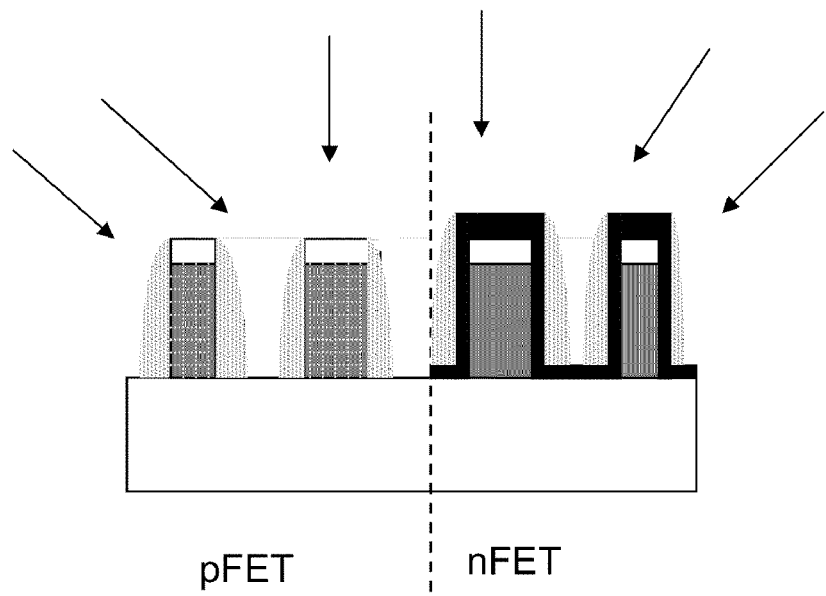

In the processing steps of FIG. 11, the remaining BSG 23 is annealed at a temperature of about 450° C. to 800° C. for about 30 seconds to about 10 minutes. This annealing process is a thermal diffusion process which results in the diffusion of the boron into the fins 16 on the pFET side of the device. Of course, by adjusting the annealing process, more or less boron will diffuse into the fins 16 on the pFET side of the device. During the annealing process, the fins 16 on the nFET side of the device are protected by the nitride liner 18.

Advantageously, the thermal diffusion of the boron will not cause damage to the fins 16 and will minimize lateral diffusion under the gate structure. The thermal diffusion process of the present invention improves the integrity of the fins 16 for subsequent epitaxial merging processes to reduce the external resistivity of the FinFET.

Figure 12:
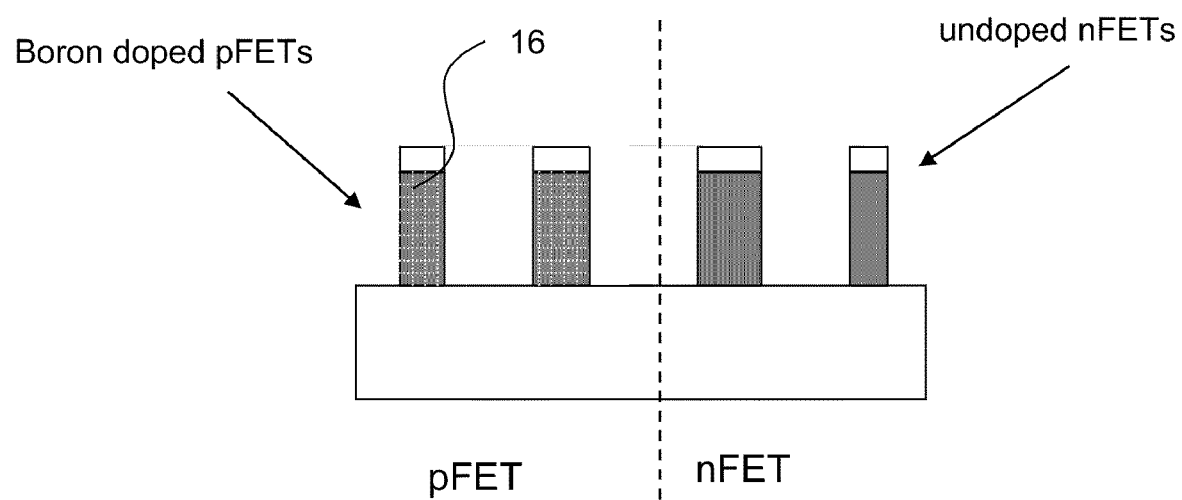
FIG. 12 shows a final structure and respective processing steps in accordance with the second aspect of the invention.

FIG. 12 shows a final structure used to build a device in accordance with aspects of the invention. In FIG. 12, the BSG and nitride liner are stripped from the nFET side of the structure. More specifically, the BSG is stripped using a diluted or buffered HF solution. The nitride liner can be stripped using a hot phosphoric acid. The resultant structure is a device with dopant diffused on the fins 16 on the nFET side of the structure.

Design Structure

Figure 13:
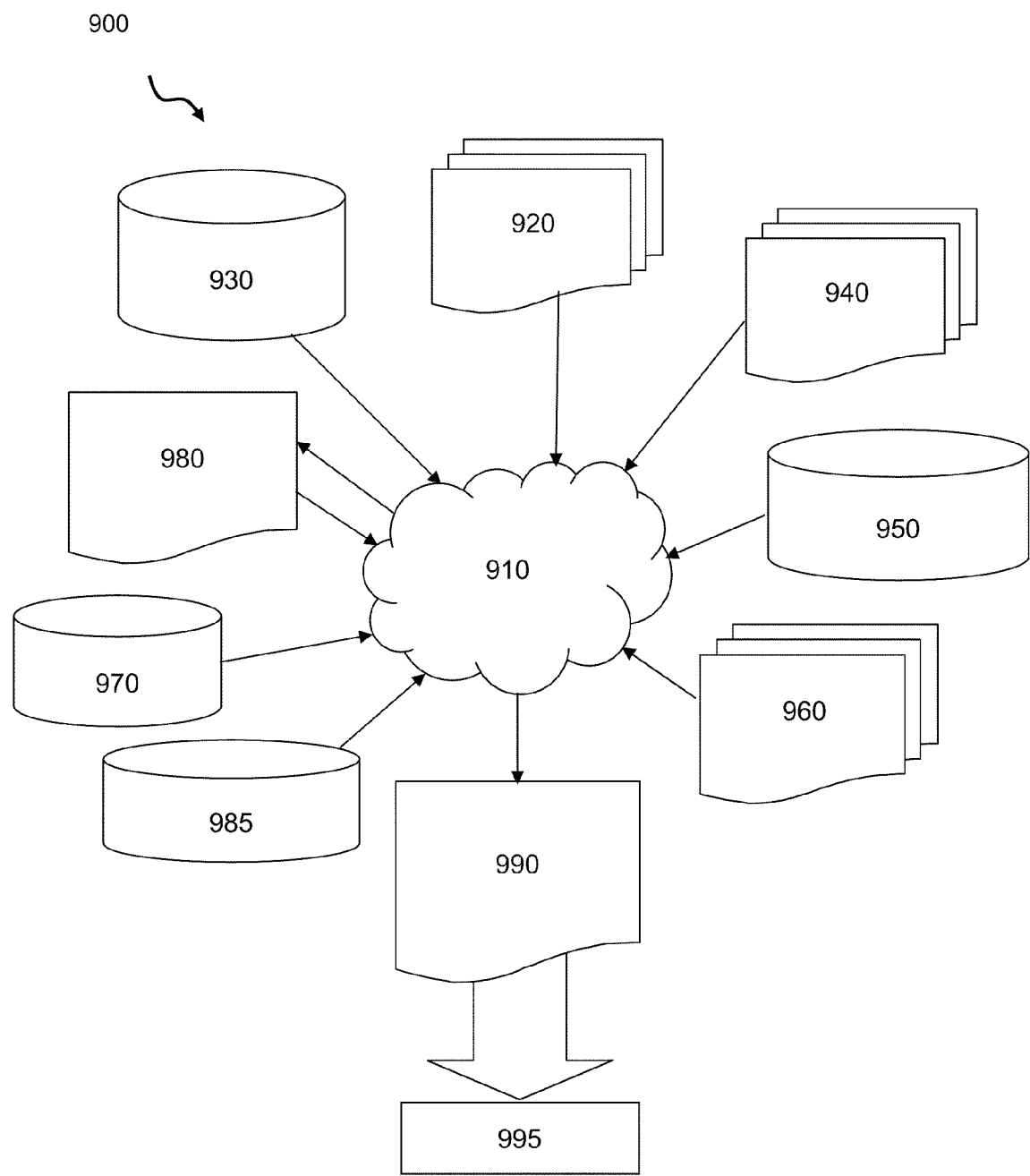
FIG. 13 is a flow diagram of a design process used in semiconductor design, manufacture, and/or test.

FIG. 13 shows a block diagram of an exemplary design flow 900 used for example, in semiconductor IC logic design, simulation, test, layout, and manufacture. Design flow 900 includes processes and mechanisms for processing design structures to generate logically or otherwise functionally equivalent representations of the embodiments of the invention shown in, e.g., FIGS. 1-12. The design structures processed and/or generated by design flow 900 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 13 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission or storage medium, design structure 920 may be accessed and processed by one or more hardware and/or software modules within design process 910 to simulate or otherwise functionally represent an electronic component, circuit, electronic or logic module, apparatus, device, or system such as those shown in, e.g., FIGS. 1-12. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in, e.g., FIGS. 1-12, to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include modules for performing standard circuit design processes such as timing analysis, verification, design rule checking, place and route operations, etc.

Design process 910 employs and incorporates well-known logic and physical design tools such as HDL compilers and simulation model build tools to process design structure 920 together with some or all of the depicted supporting data structures to generate a second design structure 990. Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in, e.g., FIGS. 1-12. In one embodiment, design structure 990 may comprise a compiled, executable HDL simulation model that functionally simulates the devices shown in, e.g., FIGS. 1-12.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in, e.g., FIGS. 1-12. Design structure 990 may then proceed to a stage 995 where, for example, design structure 990: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of forming a structure, comprising:
    forming fins on a first side and a second side of a structure;
    forming spacers of a dopant material having a first dopant type on the fins on the first side of the structure;
    annealing the dopant material such that the first dopant type diffuses into the fins on the first side of the structure; and
    protecting the first dopant type from diffusing into the fins on the second side of the structure during the annealing.

2. The method of claim 1, wherein the protecting includes lining the fins on the second side of the structure prior to the formation of the spacers.

3. The method of claim 1, wherein the dopant material is boro-silicate glass and the first dopant type is boron.

4. The method of claim 1, wherein the dopant material is phosphosilicate glass and the first dopant type is phosphorous.

5. The method of claim 1, wherein the annealing is performed at about 450° C. to 800° C. for about 30 seconds to about 10 minutes.

6. The method of claim 1, wherein the annealing the dopant material results in a three dimensional doping.

7. The method of claim 2, wherein the lining is a nitride liner.

8. The method of claim 1, wherein the forming the spacers comprises:
    depositing the dopant material directly on the fins on the first side of the structure and over a liner on the fins on the second side of the structure; and
    performing a spacer reactive ion etching to expose an underlying BOX adjacent to the fins on the first side of the structure.

9. The method of claim 1, further comprising:
    forming spacers of a second dopant material having a second dopant type on the fins on the second side of the structure;
    annealing the second dopant material such that the second dopant type diffuses into the fins on the second side of the structure; and
    protecting the second dopant type from diffusing into the fins on the first side of the structure during the annealing.

10. The method of claim 9, wherein the protecting the second dopant type from diffusing into the fins on the first side of the structure includes lining the fins on the first side of the structure prior to the forming of the spacers.

11. The method of claim 9, wherein the first dopant type is phosphorous and the second dopant type is boron.

12. A method of forming FinFET structures, comprising:
    etching fins on a first side of a structure and a second side of the structure;
    protecting the fins on the first side of the structure from a thermal diffusion process performed on the fins on the second side of the structure;
    forming spacers with a first dopant type on the fins on the second side of the structure; and performing the thermal diffusion process on the fins on the second side of the structure by annealing the spacers such that the first dopant type diffuses into the fins on the second side of the structure.

13. The method of claim 12, wherein the protecting of the fins on the first side of the structure comprises depositing a liner on the fins on the first side and the second side of the structure and etching the liner from the fins on the second side of the structure, while protecting the liner on the fins on the first side of the structure from the etching, wherein the liner protects the fins on the first side from being doped with the first dopant type.

14. The method of claim 12, wherein the first side of the structure is a pFET and the second side of the structure is an nFET.

15. The method of claim 12, wherein the first dopant type is phosphorous.

16. The method of claim 12, wherein the first dopant type is boron.

17. The method of claim 12, wherein the first dopant type diffuses into an underlying BOX to an extent of a thickness of the spacers formed on the fins on the second side of the structure.

18. The method of claim 12, wherein the forming the spacers includes:
    lining the fins on the first side of the structure with a nitride material;
    depositing material having the first dopant type on the fins on the second side of the structure; and
    performing a reactive ion etching process to form openings in the material between the fins on the second side of the structure.

19. The method of claim 12, wherein the spacers are formed to be at about 5-15 nm in thickness.

20. The method of claim 12, wherein the forming the spacers comprises:
    depositing the spacers with a dopant material directly on the fins on second side of the structure and over a liner on the fins on the first side of the structure; and
    performing a spacer reactive ion etching to expose an underlying BOX adjacent to the fins on the second side of the structure.

21. The method of claim 12, further comprising:
    forming spacers of a second dopant type on the fins on the first side of the structure;
    annealing the second dopant type such that the second dopant type diffuses into the fins on the first side of the structure; and
    protecting the second dopant type from diffusing into the fins on the second side of the structure during the annealing.

22. A method of forming a structure comprising thermally diffusing a first dopant type from a spacer material into fins on a first side of a structure while protecting fins on a second side of the structure from the first dopant type diffusing into the fins on the second side of the structure.

23. The method of claim 22, further comprising thermally diffusing a second dopant type from a spacer material into fins on the second side of a structure while protecting the fins on the first side of the structure from the second dopant type diffusing into the fins on the first side of the structure.

24. The method of claim 23, wherein the first dopant type is phosphorous and the second dopant type is boron, and the thermally diffusing the first dopant type and the second dopant type is performed by an annealing step of the spacer material of the first dopant type and the second dopant type.

25. The method of claim 24, wherein:
    the spacer material having the first dopant type is formed by:
        depositing the spacer material on the fins on the first side of the structure; and
        etching the spacer material to form opening between the fins on the first side of the structure;
    the spacer material having the second dopant type is formed by:
        depositing the spacer material on the fins on the second side of the structure; and
        etching the spacer material to form opening between the fins on the second side of the structure; and
    the protecting the fins on the first and second side of the structure are provided by depositing nitride liner over the fins.

26. The method of claim 24, wherein the first dopant type diffuses into an underlying BOX material adjacent to the fins only to an extent of a thickness of the spacers.

27. A structure, comprising:
    a first set of fins on an nFET side of the structure, the first set of fins having diffused dopant of a first dopant type and extending laterally under respective gates to an extent of a thickness of a spacer material used for thermally diffusing the first dopant type into the first set of fins; and
    a second set of fins on a pFET side of the structure, the second set of fins having diffused dopant of a second dopant type and extending laterally under respective gates to an extent of a thickness of a spacer material used for thermally diffusing the second dopant type into the second set of fins.

28. The method of claim 22, wherein the forming the spacers comprises:
    depositing the spacer material with a dopant material directly on the fins on first side of the structure and over a liner on the fins on the second side of the structure; and
    performing a spacer reactive ion etching to expose an underlying BOX adjacent to the fins on the first side of the structure.

29. The method of claim 22, further comprising:
    forming spacers of a second dopant material having a second dopant type on the fins on the second side of the structure;
    annealing the second dopant material such that the second dopant type diffuses into the fins on the second side of the structure; and
    protecting the second dopant type from diffusing into the fins on the first side of the structure during the annealing.

* * * * *